United States Patent
Lee et al.

(10) Patent No.: US 6,754,119 B2
(45) Date of Patent: Jun. 22, 2004

(54) SENSE AMPLIFIER FOR MEMORY DEVICE

(75) Inventors: Chan Yong Lee, Gyeonggi-do (KR);
Jung Bae Lee, Gyeonggi-do (KR);
Won Seok Lee, Gyeonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/002,542

(22) Filed: Nov. 13, 2001

(65) Prior Publication Data

US 2003/0021173 A1 Jan. 30, 2003

Related U.S. Application Data

(60) Provisional application No. 60/308,195, filed on Jul. 26, 2001.

(51) Int. Cl.[7] ................................. G11C 7/00
(52) U.S. Cl. ................... 365/205; 365/189.04
(58) Field of Search ................. 365/205, 204, 365/189.01, 189.04, 190, 202, 207

(56) References Cited

U.S. PATENT DOCUMENTS

| | | | | |
|---|---|---|---|---|
| 4,926,384 A | * | 5/1990 | Roy | 365/230.03 |
| 5,065,363 A | * | 11/1991 | Sato et al. | 365/154 |
| 5,295,103 A | * | 3/1994 | Yamauchi | 365/156 |
| 5,594,681 A | * | 1/1997 | Taguchi | 623/23.4 |
| 6,084,803 A | | 7/2000 | Sredanovic et al. | |
| 6,314,028 B1 | * | 11/2001 | Kono | 365/189.09 |

OTHER PUBLICATIONS

Sato, et al. Fast Cycle Ram(FCRAM); a 20–ns Random Row Access, Pipe–Lined Operating Dram 1998 pp. 22–25.
Taguchi, et al. A 40–ns 64–Mb Dram with 64–b Parallel Data Bus Architecture Nov. 1991 pp. 1493–1497.

* cited by examiner

Primary Examiner—Thong Q. Le
(74) Attorney, Agent, or Firm—Marger Johnson & McCollom, P.C.

(57) ABSTRACT

A memory charging circuit includes a read charge control circuit controlled according to a read control signal and an address value. A write charge control circuit is controlled according to a write control signal and the same or a different address value. Charging to and charging from the same data IO lines is controlled using the read charge amplifier circuit and the write charge amplifier circuit. A column select line circuit can be configured into a first arrangement where a first output is activated according to a read control signal and an address and a second output is activated according to a write control signal and the same or a different address. In a second arrangement, the first output is activated according to an address and either the read control signal or the write control signal.

48 Claims, 13 Drawing Sheets

SENSE AMPLIFIER FOR MEMORY DEVICE

This case claims priority from provisional application Serial No. 60/308,195 filed Jul. 26, 2001.

BACKGROUND

FIG. 1 shows a typical data path structure having a Bit Line Sense Amplifier (BLSA) PSA,NSA,LA,LAB, Data Input/Output lines (DIO,DIOB), Column Select Line (CSL), Memory Cell (MC): a capacitor C and an access transistor N5, Bit Line (BL), Complementary Bit Line (BLB), Data output sense amplifier 10, Loads (L1,L2), and Word Line (WL). The term DIOB refers to a complementary data IO line. A typical BLSA includes a PMOS sense amplifier (PSA) and an NMOS sense amplifier (NSA) connected to the BL and the BLB respectively.

A read operation is performed as follows. Before WL activation, the BL and the BLB are pre-charged at the same voltage level by a VBL voltage generator and an equalizing and pre-charging circuit (not shown). The VBL level is half the voltage level of VCC. If a row active command in combination with a row address is applied to a DRAM, a WL relevant to the row address is activated. The charge in a capacitor C couples and shares with the charge of the BL. This is referred to as a "Charge Sharing (CS)" operation.

A slight voltage difference between BL and BLB is generated by the CS operation, and then sense-amplified by the PSA and NSA circuits in conjunction with the sense amplifier enabling signals LA and LAB. If the charge in the capacitor C is logically "high" in other words "VCC", the BL is logically "high" and the BLB is logically "low" during the CS operation and sense-amplifying operation. The amplified data in the BL/BLB are transferred to the DIO/DIOB lines in response to a CSL signal through transistors N3 and N4, respectively. The CSL signal is enabled by a read command or write command in combination with a column address.

Two load transistors L1 and L2 are used by the data output sense amplifier 10. The load transistors L1 and L2 comprise a PMOS or NMOS transistor connected to a certain power voltage like a supply power or ground power to provide a current to the DIO and DIOB lines during a read operation. The data transferred to the DIO and DIOB lines is amplified by the data output sense amplifier 10. The amplified data is output externally through a data output buffer 20 in response to a signal (not shown).

The time between a row active command and the output of data is called the access time (tRAC). The process technology of the prior art provides a charge sharing (CS) time of about 10 ns and an access time of about 40 nanoseconds (ns) or so. In the BLSA structure shown in FIG. 1, the CS time and sense-amplifying time (SEN time) must take place before the CSL enables the charge from the BL and BLB lines onto the DIO and DIOB lines.

The capacitive loading of the DIO/DIOB lines is larger than that of the BL/BLB lines by about 10 times. If the CSL enables before BL sensing at a certain voltage level, say a delta VBL of between 0.5 Volts (V) and 1V or so, the data on the BL and BLB lines cannot be sense amplified. The voltage difference between the BL and BLB is called delta VBL. This BLSA structure is available for Dynamic Random Access Memories (DRAMs) that do not care about the CS and SEN times.

The access time tRAC can be reduced by reducing the CS time and SEN time. DRAMs with access times tRAC of about 20 ns are referred to as high-speed DRAMs or Fast Cycle Random Access Memory (FCRAM). Data input buffer 30 are used for the write operation. DIN is the data input. The data output sense amplifier 10 is used for read operations.

FIG. 2 shows a timing diagram for FIG. 1 when the read operation data is "1". Every command is synchronized with the rising edge of the clock signal. A ROW ACTIVE command with address (row address) enables a specific Word Line (WL). A READ command with address (column address) enables the CSL signal. In the structure of FIG. 1, the CS time and SEN time should be completed before the CSL line is enabled. The enable point for the LA and LAB is determined by the memory chip designer. After the CSL is enabled, the data on the BL and BLB lines is transferred to the DIO and DIOB lines. Finally, the data on the DIO and DIOB lines is transferred to the data output buffer (DOUT) 20. The DOUT is normally pre-charged at a Hi-Z level before the data is transferred.

FIG. 3 shows a typical data path structure for a conventional high-speed Bit line Sense Amplifier (BLSA) in a semiconductor memory device. This BLSA is described in farther detail in "A 40-ns 64-Mb DRAM with 64-b Parallel Data Bus Architecture" Taguchi et. al. IEEE Journal of solid state circuit, Vol.26, NO.11, pp.1493~1497, November 1991".

FIG. 3 shows separate Column Select Lines (CSLs) WCSL and RCSL and separate data lines RDO/RDOB and WDI/WDIB for read and write operations, respectively. For the high-speed read operation, a direct sense amplifier is implemented in the BLSA and is referred to as a Read Sense Amplifier (RSA). The RSA operates like a differential amplifier. In this disclosure, Direct SA, RSA and differential amplifier mean the same thing. A slight voltage difference is amplified by the RSA. In this case, the RCSL enable timing can be faster than the CSL timing shown in the FIG. 1 scheme. A designer can select the CSL enable timing point, then design a shorter tRAC for the FCRAM.

Since RCSL may be activated even before the WL is activated, most of the CS time and SEN time is not required in this scheme. In other words, as soon as WL is activated, RCSL can be activated. If a slight voltage difference exists between the BL and the BLB, RSA amplifies the BL and the BLB without the PSA and NSA. Data errors seldom occur in this scheme. Although the loading of the DIO line is large, this differential amplifier RSA can amplify the slight difference of the voltage.

However, this scheme has a problem. By implementing the RSA, the read and write paths need to be implemented separately so that data contention does not occur during the read operation and write operations. This requires a larger IC layout area than any other sense amplifier schemes.

FIG. 4 shows a timing diagram for FIG. 3 when data is "1". As shown, RCSL reduces the enabling time. Most of the CS time and SEN time is not needed to enable the CSL. This provides faster RCSL enabling and as a result a shorter access time tRAC.

FIG. 5 shows another typical data path structure that includes a conventional high-speed BLSA for a semiconductor memory device. The WR signal is only used when a write command is entered. The WR signal does not include any address information. The CSL is used during both write and read operations. Data input lines and output lines are also commonly used. The DIOG3 includes 4 transistors, N11, N12, N13 and N14. The DIOG3 Data Input/Output gate transistors considerably increase the layout area in DRAMs. Another problem is an increase in the current consumption caused by the RSA operating for both read and write operations in response to the WR and CSL.

The present invention addresses this and other problems associated with the prior art.

SUMMARY OF THE INVENTION

A memory charging circuit includes a read charge control circuit controlled according to a read control signal and an address value. A write charge control circuit is controlled according to a write control signal and the same or a different address value. Charging to and charging from the same data IO lines is controlled using the read charge amplifier circuit and the write charge amplifier circuit.

A column select line circuit can be configured into a first arrangement where a first output is activated according to a read control signal and an address and a second output is activated according to a write control signal and the same or a different address. In a second arrangement, the first output is activated according to an address and either the read control signal or the write control signal.

The foregoing and other objects, features and advantages of the invention will become more readily apparent from the following detailed description of a preferred embodiment of the invention which proceeds with reference to the accompanying drawings.

DETAILED DESCRIPTION

Figure 5:
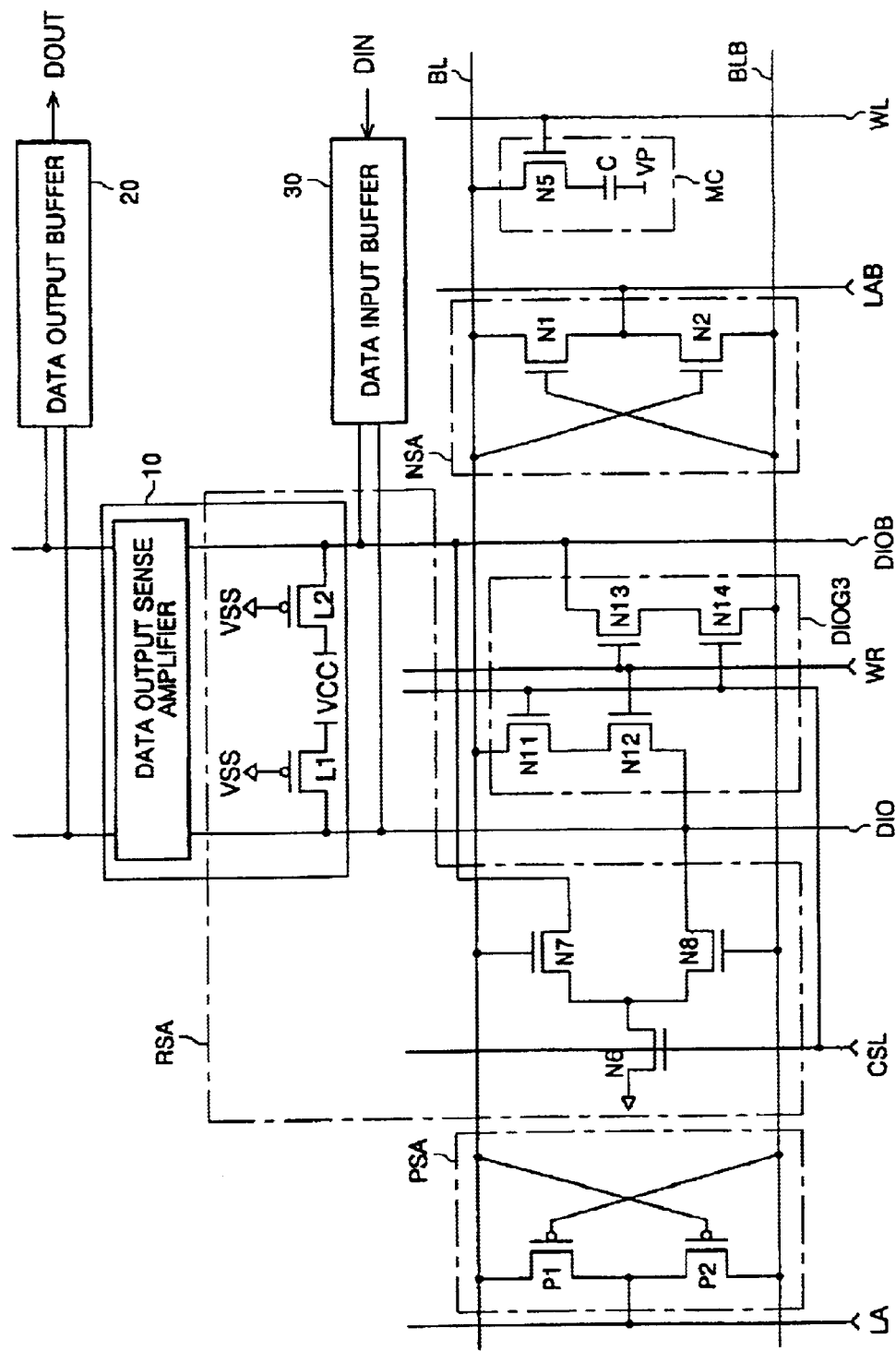
FIG. 5 is a circuit diagram of yet another data path structure.
Figure 6:
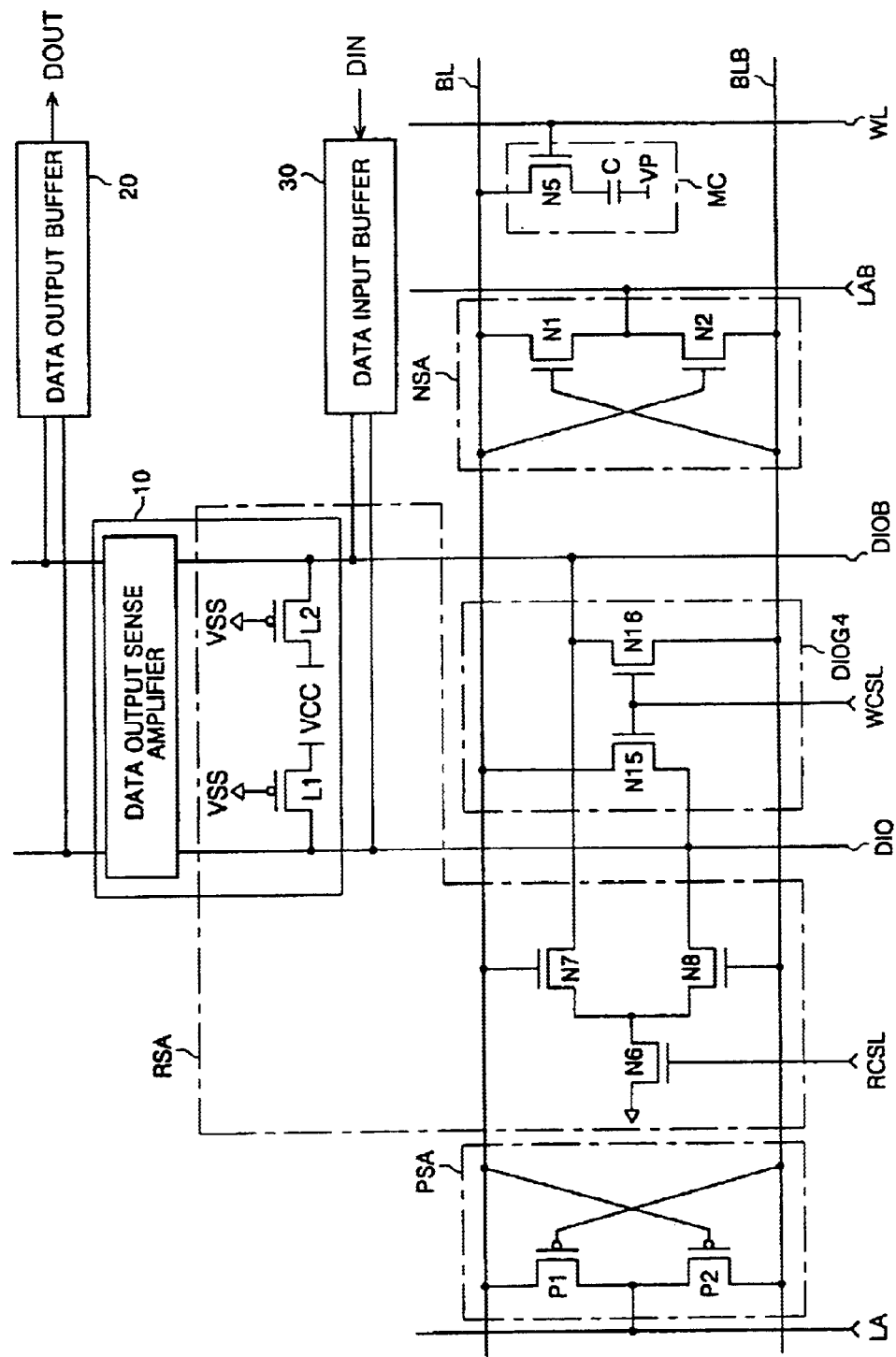
FIG. 6 is a diagram of a charge control circuit according to one aspect of the invention.

FIG. 6 shows an embodiment of data path structure having a new high-speed Bit Line Sensing Amplifier (BLSA) for a semiconductor memory device. The BLSA includes a PSA, NSA, RSA, DIOG4, RCSL, WCSL, DIO/DIOB, etc. that operate in a manner as described above. One difference between FIG. 6 and FIG. 5 is the DIOG4. The DIOG4 only has two transistors, N15, N16. This reduces layout area in the memory core. Core refers to a portion of the memory cell arrays, Bit Lines (BLs), BLSA, and Word Line related circuits, etc.

Figure 1:
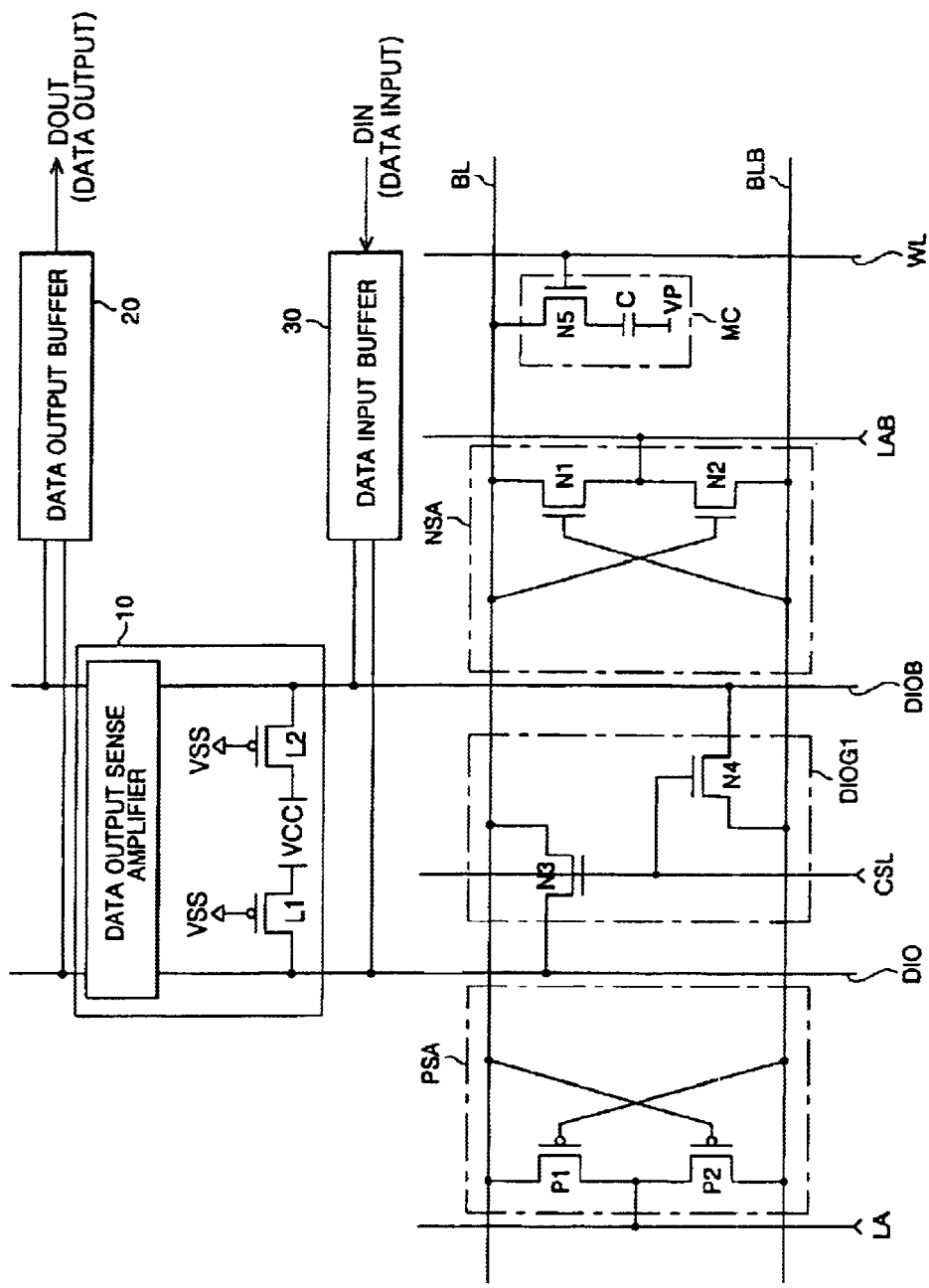
FIG. 1 is a diagram of a circuit diagram of a memory data path structure.
Figure 2:
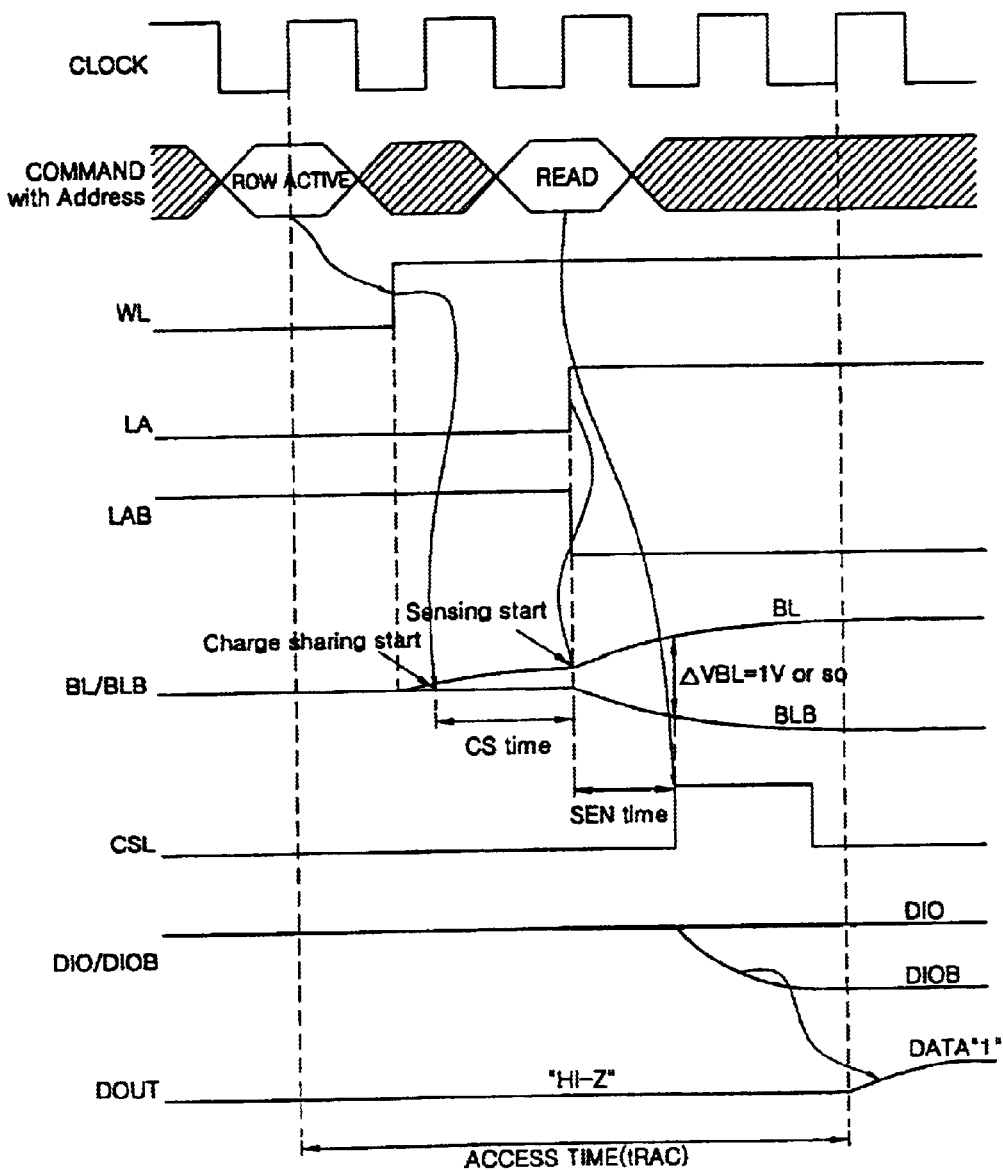
FIG. 2 is a timing diagram for the circuit of FIG. 1.
Figure 3:
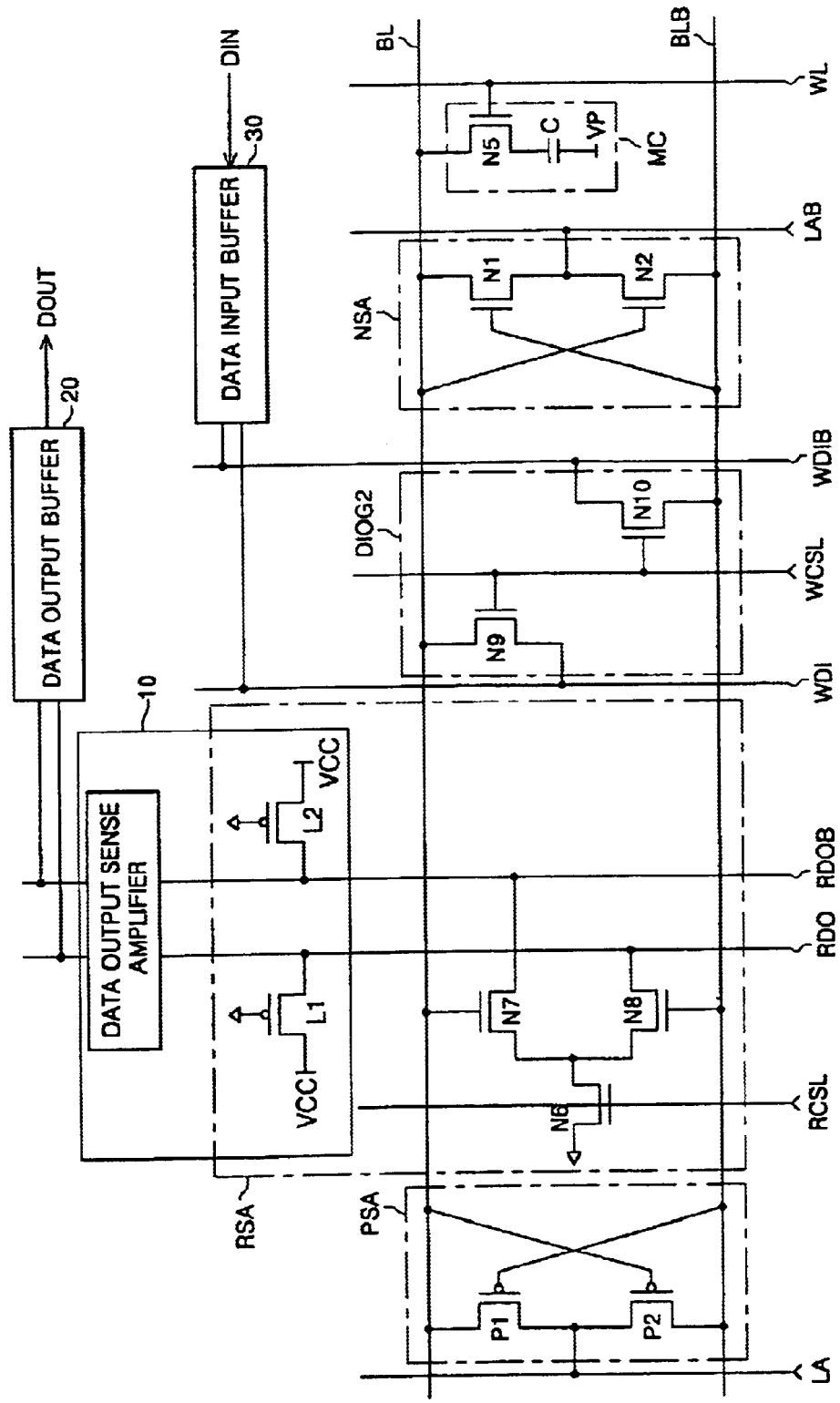
FIG. 3 is a circuit diagram of another memory data path structure.
Figure 4:
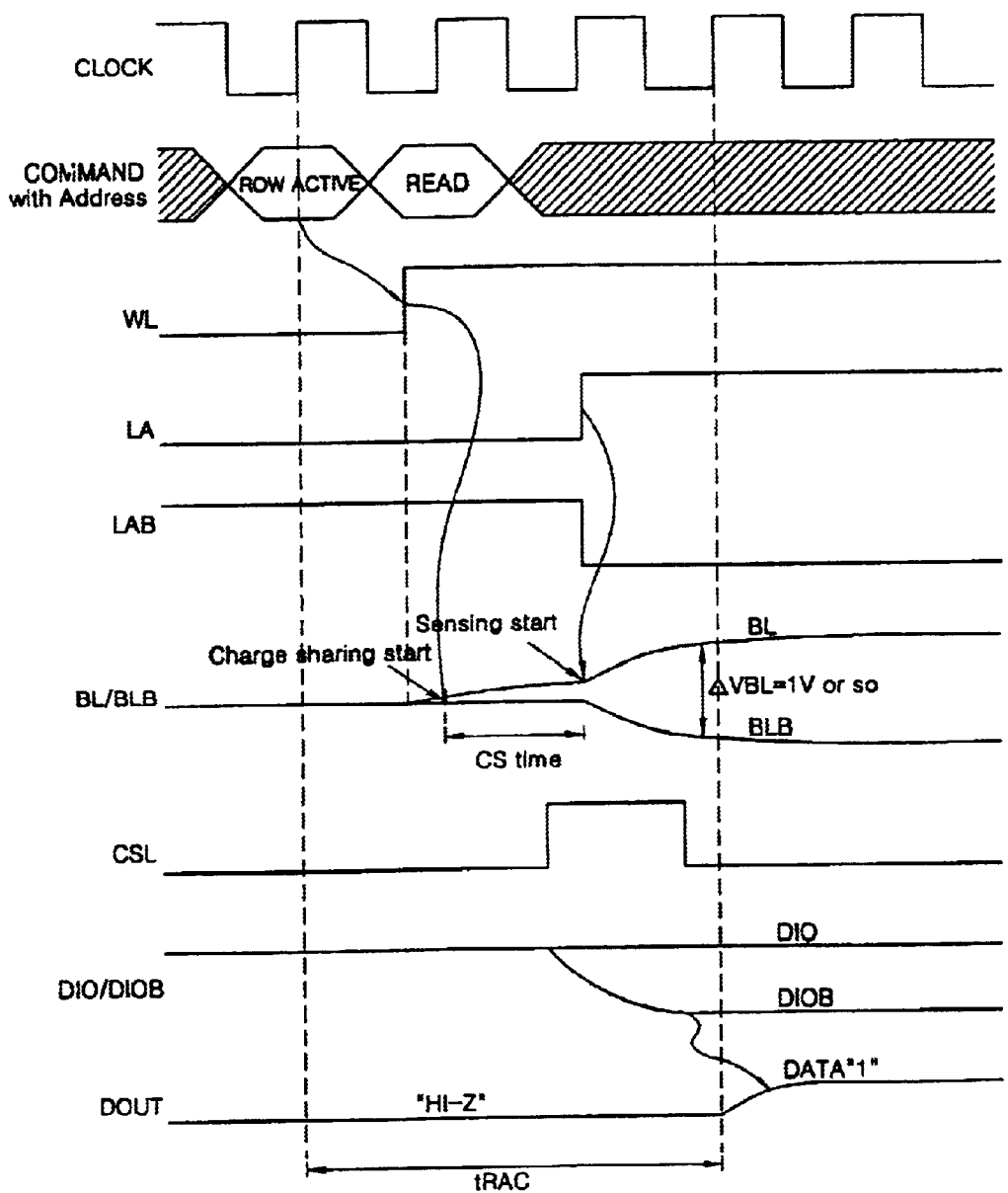
FIG. 4 is a timing diagram for the circuit of FIG. 3.

The RCSL operates during read operations, and the WCSL operates during write operations. The RSA can be a direct amplifier or differential amplifier. The load transistors L1 and L2 are shared by the RSA and data output sense amplifier. The load transistors L1 and L2 provide current to the data output sense amplifier 10. The timing diagram for the circuit shown in FIG. 6 is the same as the timing diagram shown in FIG. 4. However, the circuit in FIG. 6 requires a smaller layout area than the circuits shown in FIG. 3 or FIG. 5 and has a faster access time than the circuit shown in FIG. 1.

The BL/BLB data is amplified responding to the RCSL signal enabled high and then the amplified BL/BLB data is transferred to the DIO/DIOB lines. If the WCSL line is enabled high (write operation), data on the DIO/DIOB lines is transferred to the BL/BLB lines.

Figure 7:
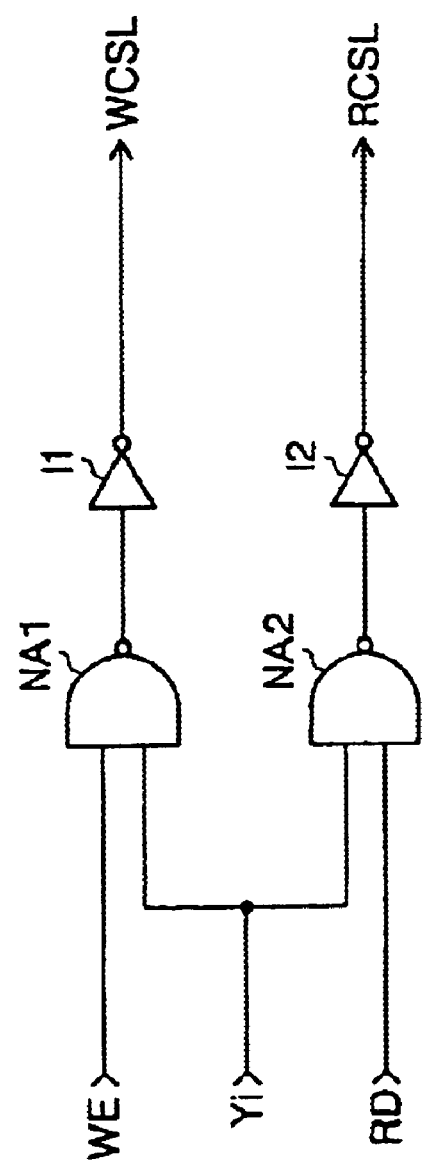
FIG. 7 is a diagram of a column select line circuit.
Figure 8A:
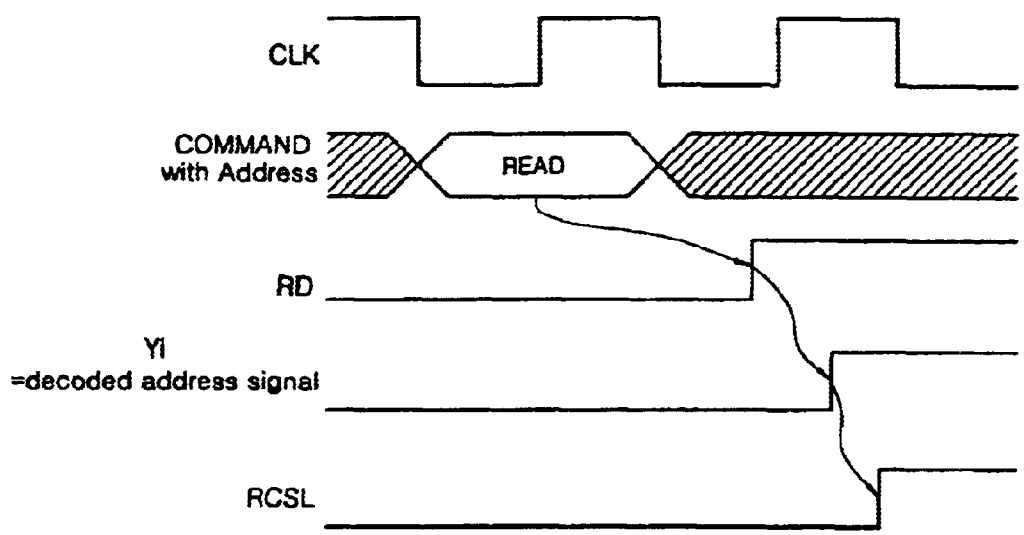
FIG. 8 is a timing diagram for the circuit shown in FIG. 7.
Figure 8B:
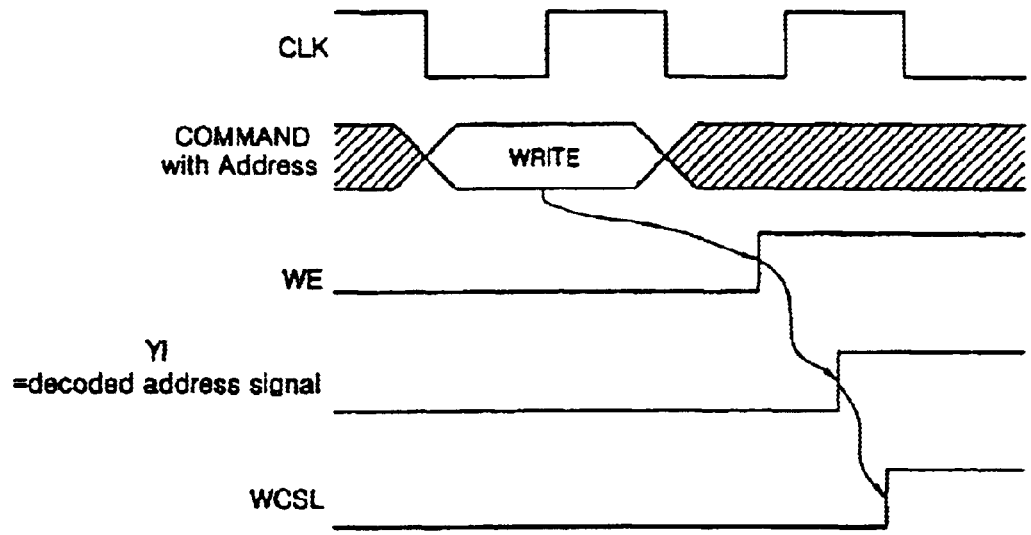

FIGS. 7–12 are circuits and timing diagrams showing operation of RCSL and WCSL signals. The signals generated in FIGS. 7, 9, and 11 can be applied to the BLSA circuit of FIG. 6. FIG. 7 shows a conventional scheme for generating the CSL signals. A Write Enable (WE) signal is a write command or write-related signal. The RD signal is a read command or read-related signal. Yi is a decoded column address signal. In the case of FCRAMs, when RD and Yi are enabled high, the RCSL signal is enabled high, activating the RSA in FIG. 6. FIGS. 8a and 8b show the timing diagram of read and write operation of FIG. 7, respectively.

Figure 9:
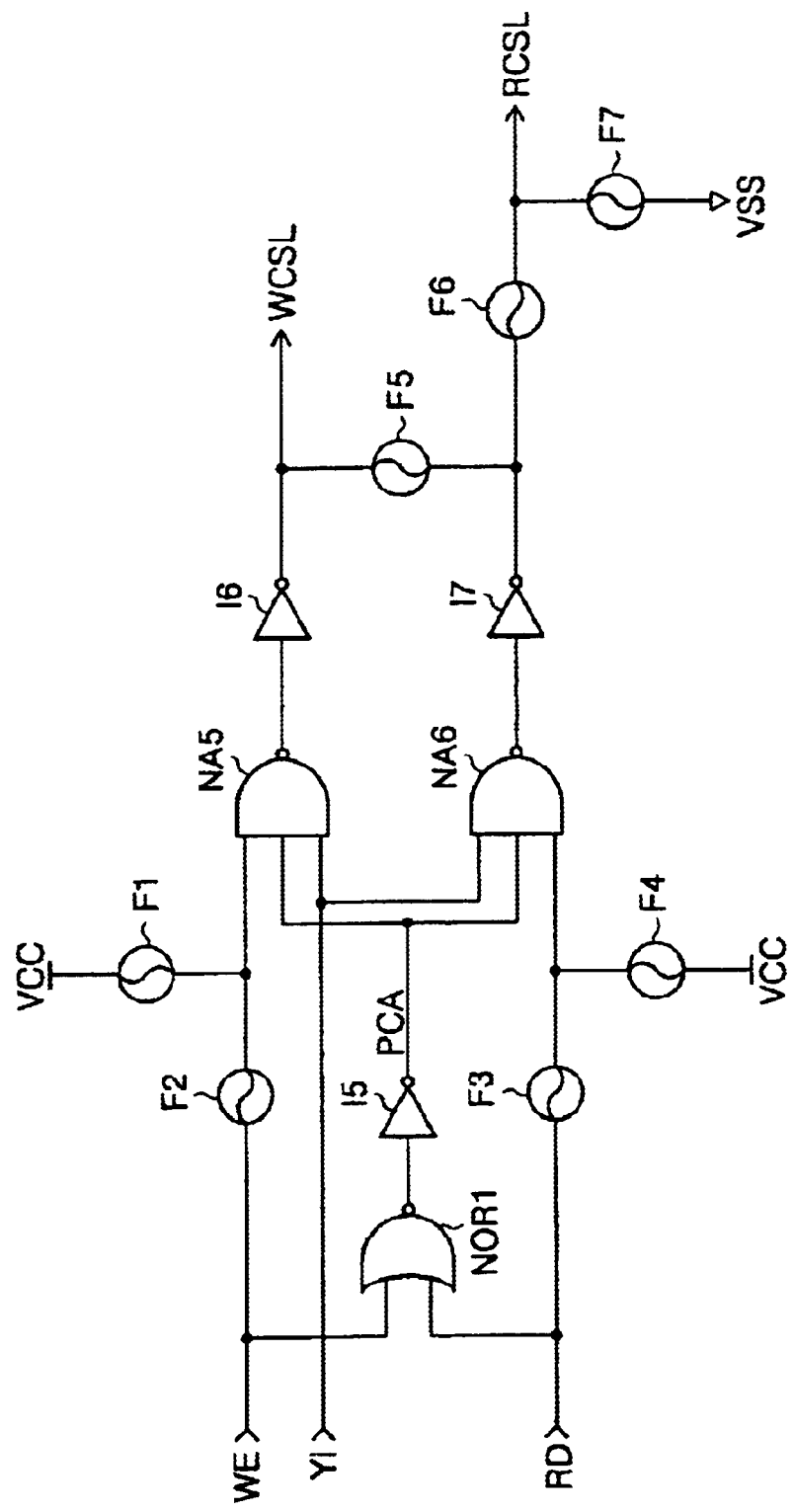
FIG. 9 is a configurable column select line circuit according to another aspect of the invention.

FIG. 9 shows another aspect of the invention showing a circuit that generates the WCSL and RCSL signals. A PCA signal is generated whenever a read or write operation is activated. In one configuration, fuses F1, F4, F5 and F7 are cut. In the write operation, logic-high PCA and logic-high Yi activates the WCSL signal while the RCSL signal is disabled. This causes the RSA in the FIG. 6 not to operate. In the read operation, the RCSL signal is enabled and RSA operates.

In another configuration, fuses F2, F3, and F6 are cut. The RCSL fixes at a ground voltage level (VSS) while the WE and RD signals are fixed at a power supply voltage level (VCC). In this configuration, the WCSL signal is used during both read and write operations. In this case inverters I5 and I6 both operate as drivers for the WCSL signal providing more current driving capability. This improves the WCSL enable timing.

Figure 10:
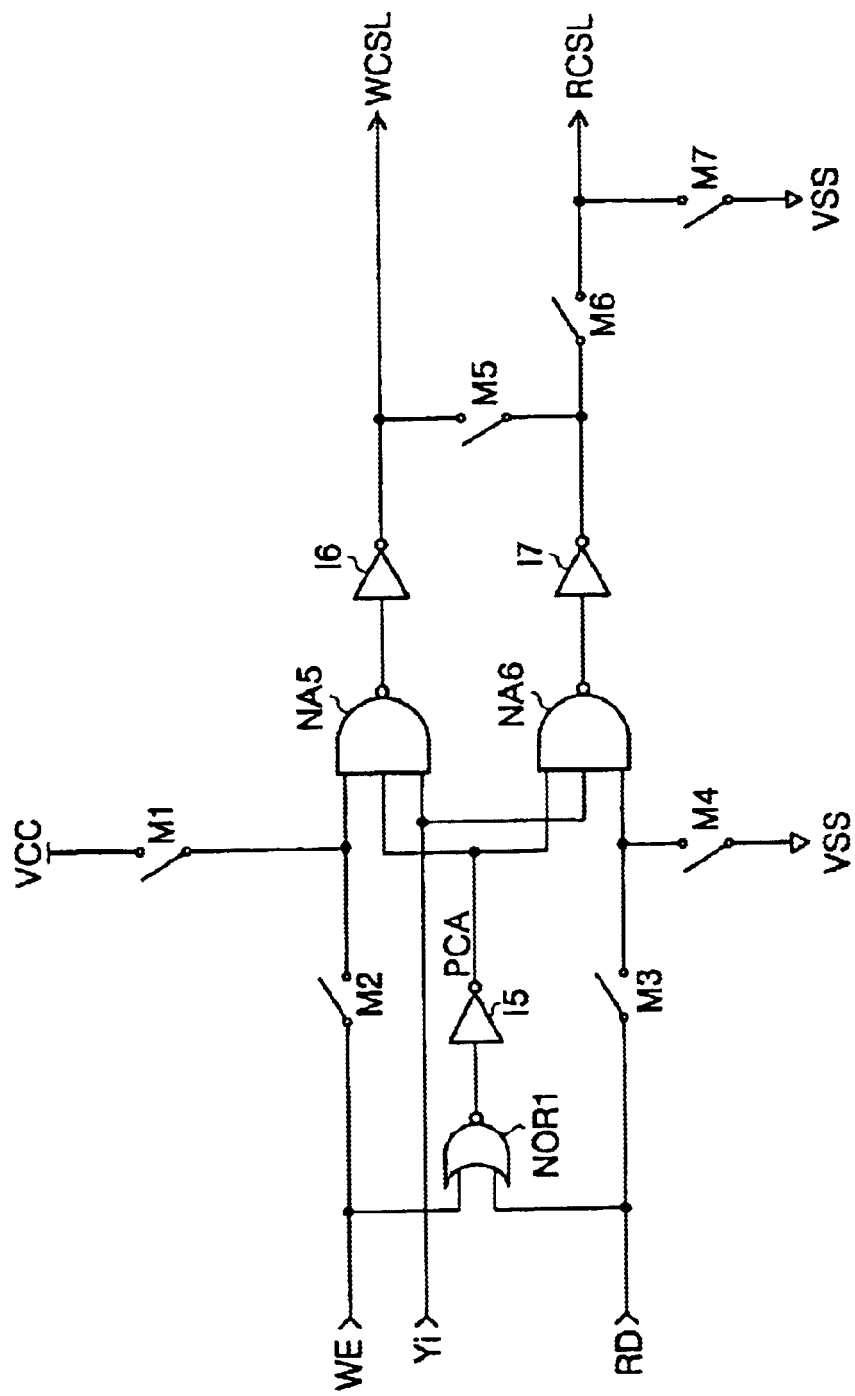
FIG. 10 is an alternative embodiment of the configurable column select line circuit.

FIG. 10 shows another embodiment of the invention where the fuses in FIG. 9 are replaced by a conducting layer like a metal line or poly-silicon line. Contacts M1–M7 represent conducting layers that have either been left open or closed by the metal or polysilicon line. The contacts M1–M7 are left open or closed in the same manner described above in FIG. 9 to enable WCSL and RCSL. For example, contacts M1, M2, M5 and M7 are left open and the remaining contacts are shorted. In this configuration, the write operation, logic-high PCA and logic-high Yi activates the WCSL signal while the RCSL signal is disabled. In the read operation, the RCSL signal is enabled and RSA operates. When contacts M2, M3 and M6 are left open and the remaining contacts shorted, WCSL is used during both read and write operations.

Figure 11A:
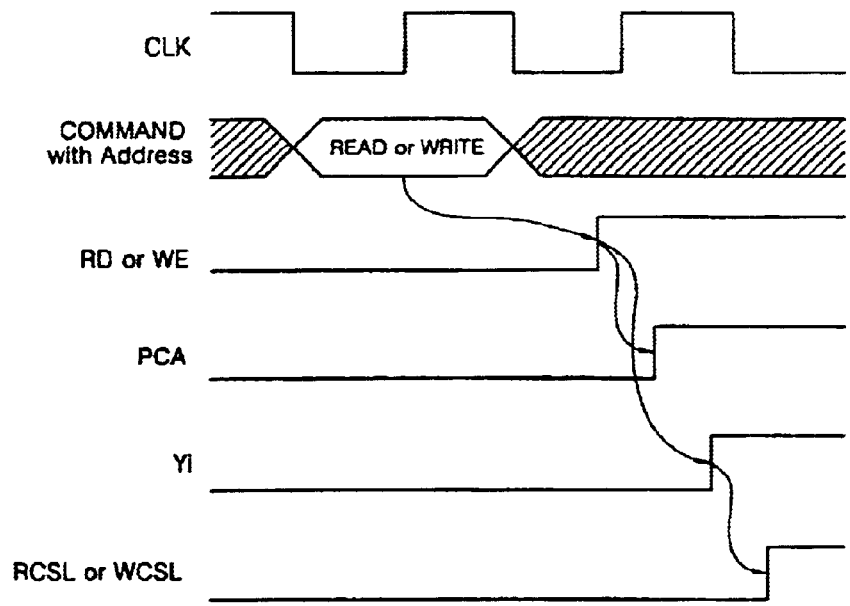
FIG. 11 is a timing diagram for the configurable column select line circuit.
Figure 11B:
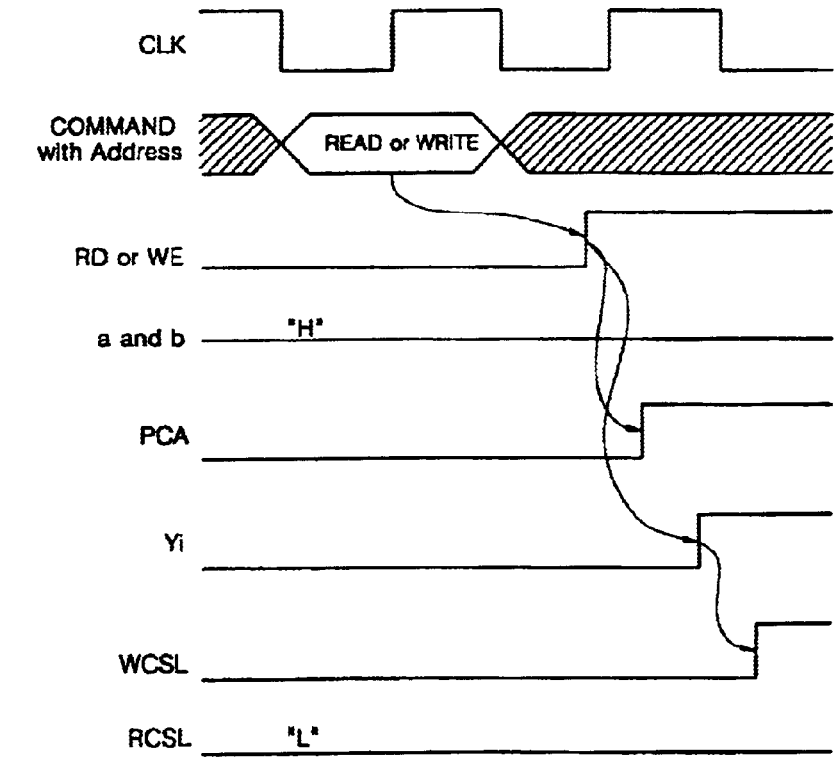

FIGS. 11a and 11b show the timing for the WCSL and RCSL signals of FIG. 9 and FIG. 10. FIG. 11a shows the timing when the fuses F1, F4, F5, and F7 are cut or the contacts M1, M4, M5 and M7 are left open. In this fuse configuration, the WCSL signal is enabled during a write operation and the RCSL signal is enabled during a read operation. The RCSL and WCSL signals generated in FIG. 11a are used for the circuit in FIG. 6. This CSL scheme provides faster DRAM access times.

FIG. 11b shows the timing in the case where fuses F2, F3 and F6 are cut or the contacts M2, M3 and M6 are left open and the remaining contacts shorted by the metal or polysilicon lines. In this case, the WCSL signal is enabled during both read and write operations. The RCSL signal is fixed at a ground voltage level (VSS).

Figure 12:
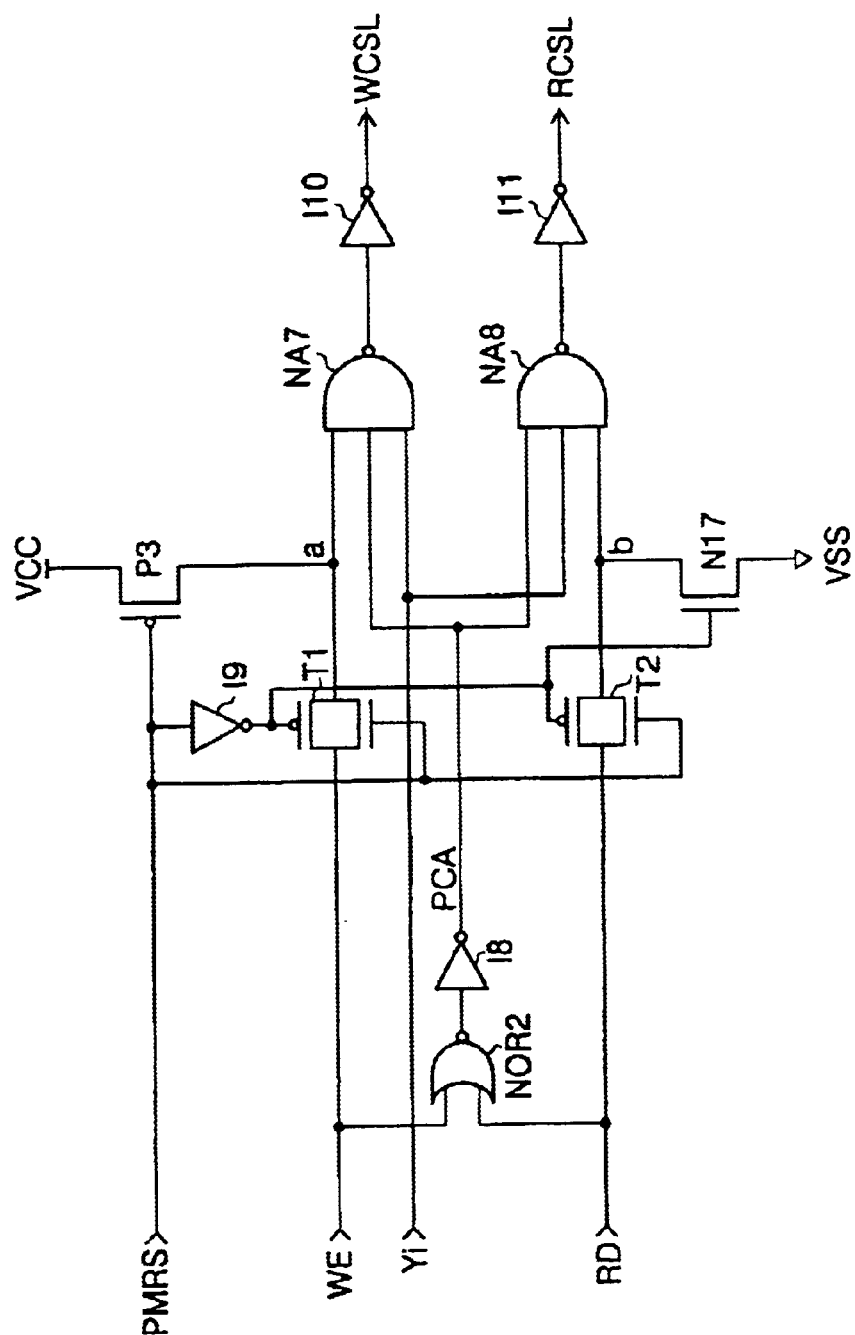
FIG. 12 is another embodiment of the configurable column select line circuit

FIG. 12 shows another embodiment where a Mode Register Set (MRS) command or signal is generated in the DRAM right after power-up. The MRS may be programmed after power-up and before normal operation. In addition, the MRS may also be changed during normal operation. The MRS command or signal is applied for initially determining how the DRAM operates. The MRS signal sets CL (CAS Latency), BL (Burst Length), etc., and is a combination of external command signals (CLOCK, CSB, RASB, CASB, WEB) and a plurality of addresses. The CSB signal refers to a chip select signal and the RASB signals refers to a row address strobe signal. The CASB signals refers to a column address strobe signal and the WEB signal refers to a write enable signal. The last character "B" refers to a bar-triggered-enable signal.

Figure 13A:
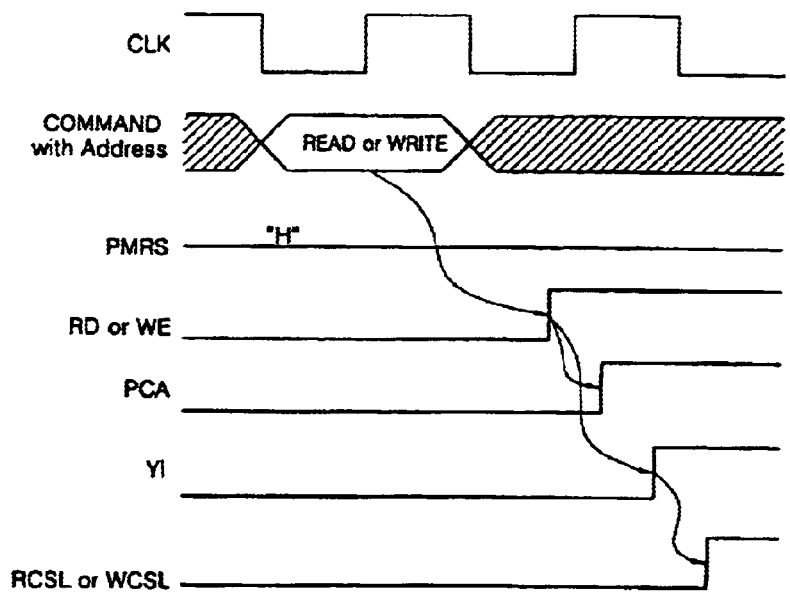
FIG. 13 is a timing diagram for the configurable column select line circuit shown in FIG. 12.
Figure 13B:
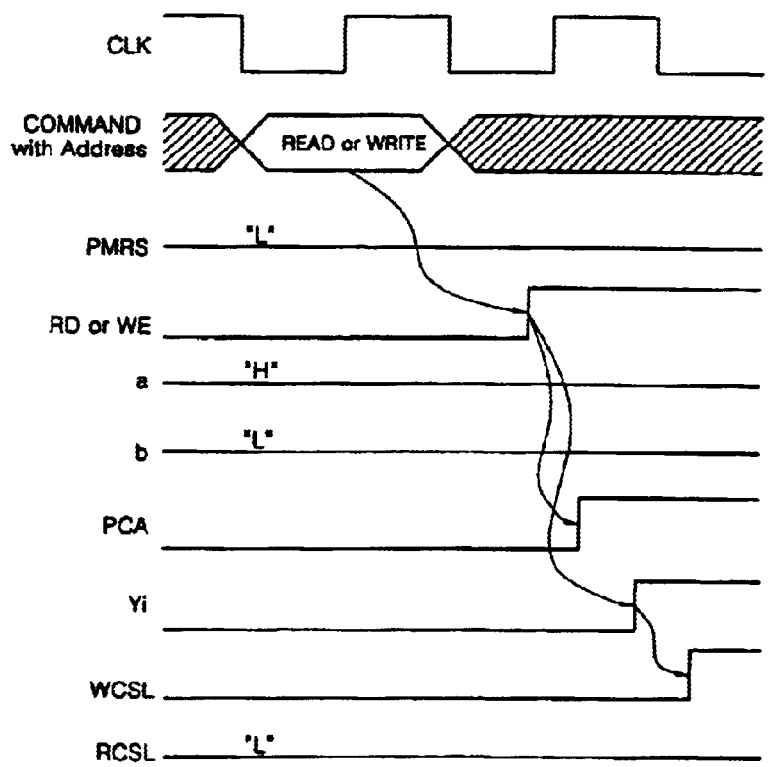

The device-internal signal of the MRS command is a PMRS signal like that of FIG. 12 and is described in detail in U.S. Pat. No. 6,084,803 in FIGS. 3, 4, 5A, 5B, 5C, and 5D and in the specification at col. 3, lines 40–67, col. 4, and col.5, which is herein incorporated by reference. When the PMRS signal is set high, the WE and RD signals are not fixed at a voltage level, and the WCSL and RCSL signals are operated independently. This configuration is used for the FCRAM circuit shown in FIG. 6. When the PMRS signal has a logic-low setting, the WE and RD signal path is blocked by the gate transistors (T1 and T2). The RCSL signal is set low by the PMRS signal and the WCSL is the only signal used as the CSL during the read and write operations. The PCA signal is then enabled during both read and write operations. The timing diagram for the two configurations of FIG. 12 are shown in FIGS. 13a and 13b.

The system described above can use dedicated processor systems, micro controllers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention may be modified in arrangement and detail without departing from such principles. I claim all modifications and variation coming within the spirit and scope of the following claims.

What is claimed is:

1. A circuit, comprising:
   a read charge control circuit activated only during read operations by a read signal and an address; and
   a write charge control circuit activated by a write signal and the same or a different address, the read charge control circuit and the write charge control circuit both coupled to a first and a second data IO line, wherein the second data IO line is complementary to the first data IO line.

2. The circuit according to claim 1 wherein the read charge control circuit is a sense amplifier.

3. The circuit according to claim 1 wherein the write charge control circuit transfers charge between at least one of the first and second data IO lines and a bit line.

4. The circuit according to claim 1 wherein the write charge control circuit includes only two write controlled gates, a first one of the write controlled gates controlling charge of a bit line and a second one of the write controlled gates controlling charge of a complementary bit line.

5. The circuit according to claim 4 wherein the first and second write controlled gates are both controlled by a write column select line signal.

6. The circuit according to claim 4 wherein the first write controlled gate is coupled directly between the bit line and the first data IO line and the second write controlled gate is coupled directly between the complementary bit line and the second data IO line.

7. The circuit according to claim 1 wherein the read charge control circuit includes a first read controlled gate controlling charge from a bit line to the second data IO line and a second read controlled gate controlling charge from a complementary bit line to the first data IO line.

8. The circuit according to claim 7 wherein the first and second read controlled gates are both controlled by a read column select line signal.

9. The circuit according to claim 7 wherein the first read controlled gate is coupled directly between the bit line and the second data IO line and the second read controlled gate is coupled directly between the complementary bit line and the first data IO line.

10. The circuit according to claim 1 including a data output sense amplifier coupled between a data output buffer and the first and second data IO lines.

11. The circuit according to claim 10 including load transistors shared between the read charge control circuit and the data output sense amplifier.

12. The circuit according to claim 1 wherein the read charge control circuit includes:
   a first transistor having a first terminal coupled to a bit line, a second terminal coupled to the second data IO line, and a third terminal;
   a second transistor having a first terminal coupled to a complementary bit line, a second terminal coupled to the first data IO line, and a third terminal; and
   a third transistor having a first terminal coupled to a column select line, a second terminal coupled to the third terminal of the first and second transistor, and a third terminal coupled to a first reference voltage.

13. The circuit according to claim 12 wherein the write charge control circuit includes:
   a first transistor having a first terminal coupled to a write column select line, a second terminal coupled to the complementary bit line, and a third terminal coupled to the second data IO line; and
   a second transistor having a first terminal coupled to the write column select line, a second terminal coupled to the first data IO line, and a third terminal coupled to the bit line.

14. The circuit according to claim 13, further comprising:
   a first load transistor having a first terminal coupled to a second reference voltage, a second terminal coupled to the first data IO line, and a third terminal coupled to a third reference voltage; and
   a second load transistor having a first terminal coupled to the second reference voltage, a second terminal coupled to the second data IO line, and a third terminal coupled to the third reference voltage.

15. A circuit, comprising:
a read charge control circuit activated by a read column select line;
a write charge control circuit activated by a write column select line, wherein the read charge control circuit and the write charge control circuit are both coupled to common data IO lines;
a data output sense amplifier; and
load transistors shared by both the read charge control circuit and the data output sense amplifier.

16. The circuit of claim 15, wherein the write charge control circuit is activated independently of the read column select line used for activating the read charge control circuit.

17. The circuit of claim 15, wherein the read charge control circuit is a sense amplifier.

18. The circuit of claim 15, wherein the write charge control circuit transfers charge between the common data IO lines and bit lines.

19. The circuit of claim 15, wherein the write charge control circuit includes only two write controlled gates, a first one of the write controlled gates controlling charge of a bit line and a second one of the write controlled gates controlling charge of a complementary bit line.

20. The circuit of claim 19, wherein the first and second write controlled gates are both controlled by a write column select line signal.

21. The circuit of claim 19, wherein the first write controlled gate is coupled directly between the bit line and data IO line and the second write controlled gate is coupled directly between the complementary bit line and a complementary data IO line.

22. The circuit of claim 15, wherein the read charge control circuit includes a first read controlled gate controlling charge from a bit line to a complementary data IO line and a second read controlled gate controlling charge from a complementary bit line to a data IO line.

23. The circuit of claim 22, wherein the first and second read controlled gates are both controlled by the read column select line.

24. The circuit of claim 22, wherein the first read controlled gated is coupled directly between the bit line and the complementary data IO line and the second read controlled gate is coupled directly between the complementary bit line and the data IO line.

25. The circuit of claim 15, wherein the data output sense amplifier is coupled between a data output buffer and the common data IO lines.

26. The circuit of claim 15, wherein the read charge control circuit includes:
a first transistor having a first terminal coupled to a bit line, a second terminal coupled to a complementary data IO line and a third terminal;
a second transistor having a first terminal coupled to a complementary bit line, a second terminal coupled to a data IO line and a third terminal; and
a third transistor having a first terminal coupled to the read column select line, a second terminal coupled to the third terminal of the first and second transistors and a third terminal coupled to a first reference voltage.

27. The circuit of claim 26, wherein the write charge control circuit includes:
a first transistor having a first terminal coupled to the write column select line, a second terminal coupled to the complementary bit line and a third terminal coupled to the complementary data IO line; and
a second transistor having a first terminal coupled to the write column select line, a second terminal coupled to the data IO line and a third terminal coupled to the bit line.

28. The circuit according to claim 27 including
a first load transistor having a first terminal coupled to a second reference voltage, a second terminal coupled to the data IO line and a third terminal coupled to a third reference voltage; and
a second load transistor having a first terminal coupled to the second reference voltage, a second terminal coupled to the complementary data IO line and a third terminal coupled to the third reference voltage.

29. A circuit, comprising:
a read charge control circuit activated only during read operations by a read signal and an address, the read charge control circuit coupled to a first and a second data IO line, wherein the second data IO line is complementary to the first data IO line; and
a write charge control circuit activated by a write signal and the same or a different address, the write charge control circuit coupled to the first and the second data IO line, wherein the write charge control circuit includes only two write controlled gates, a first one of the write controlled gates controlling charge of a bit line and a second one of the write controlled gates controlling charge of a complementary bit line.

30. The circuit of claim 29, wherein the first and second write controlled gates are both controlled by a write column select line signal.

31. The circuit of claim 29, wherein the first write controlled gate is coupled directly between the bit line and the first data IO line and the second write controlled gate is coupled directly between the complementary bit line and the second data IO line.

32. A circuit, comprising:
a read charge control circuit that is activated only during read operations by a read signal and an address,
wherein the read charge control circuit is coupled to a first and a second data IO line,
wherein the second data IO line is complementary to the first data IO line, and
wherein the read charge control circuit includes a first read control gate that controls charge from a bit line to the second data IO line and a second read control gate that controls charge from a complementary bit line to the first data IO line; and
a write charge control circuit activated by a write signal and the same or a different address, wherein the write charge control circuit is coupled to the first and the second data IO line.

33. The circuit of claim 32, wherein the first and second read control gates are both controlled by a read column select line signal.

34. The circuit of claim 32, wherein the first read control gate is coupled directly between the bit line and the second data IO line and the second read control gate is coupled directly between the complementary bit line and the first data IO line.

35. A circuit, comprising:
a read charge control circuit activated only during read operations by a read signal and an address and coupled to a first and a second data IO line, wherein the second data IO line is complementary to the first data IO line;
a write charge control circuit activated by a write signal and the same or a different address, the write charge control circuit coupled to the first and the second data IO line;
a data output sense amplifier coupled between a data output buffer and the first and second data IO lines; and
load transistors shared between the read charge control circuit and the data output sense amplifier.

36. A circuit, comprising:
a read charge control circuit activated only during read operations by a read signal and an address and coupled to a first and a second data IO line, wherein the second data IO line is complementary to the first data IO line, and
a write charge control circuit activated by a write signal and the same or a different address, the write charge control circuit coupled to the first and the second data IO line;
wherein the read charge control circuit comprises
a first transistor having a first terminal coupled to a bit line, a second terminal coupled to the second data IO line, and a third terminal;
a second transistor having a fourth terminal coupled to a complementary bit line, a fifth terminal coupled to the first data IO line, and a sixth terminal, and
a third transistor having a seventh terminal coupled to a column select line, an eighth terminal coupled to the third terminal and the sixth terminal, and a ninth terminal coupled to a first reference voltage.

37. The circuit of claim 36, wherein the write charge control circuit comprises:
a fourth transistor with a tenth terminal coupled to a write column select line, an eleventh terminal coupled to the complementary bit line, and a twelfth terminal coupled to the second data IO line; and
a fifth transistor with a thirteenth terminal coupled to the write column select line, a fourteenth terminal coupled to the first data IO line, and a fifteenth terminal coupled to the bit line.

38. The circuit of claim 36, further comprising:
a first load transistor having a sixteenth terminal coupled to a second reference voltage, a seventeenth terminal coupled to the first data IO line, and an eighteenth terminal coupled to a third reference voltage; and
a second load transistor having a nineteenth terminal coupled to the second reference voltage, a twentieth terminal coupled to the second data IO line, and a twenty-first terminal coupled to the third reference voltage.

39. A circuit, comprising:
a read charge control circuit activated only during read operations by a read signal and an address; and
a write charge control circuit activated by a write signal and the same or a different address, the read charge control circuit and the write charge control circuit both coupled to a first and a second data IO line, wherein the second data IO line is complementary to the first data IO line, and wherein the write charge control circuit includes only two write controlled gates, a first one of the write controlled gates controlling charge of a bit line and a second one of the write controlled gates controlling charge of a complementary bit line.

40. The circuit according to claim 39 wherein the first and second write controlled gates are both controlled by a write column select line signal.

41. The circuit according to claim 39 wherein the first write controlled gate is coupled directly between the bit line and the first data IO line and the second write controlled gate is coupled directly between the complementary bit line and the second data IO line.

42. A circuit, comprising:
a read charge control circuit activated only during read operations by a read signal and an address, wherein the read charge control circuit includes a first read controlled gate controlling charge from a bit line to the second data IO line and a second read controlled gate controlling charge from a complementary bit line to the first data IO line; and
a write charge control circuit activated by a write signal and the same or a different address, the read charge control circuit and the write charge control circuit both coupled to a first and a second data IO line, wherein the second data IO line is complementary to the first data IO line.

43. The circuit according to claim 42 wherein the first and second read controlled gates are both controlled by a read column select line signal.

44. The circuit according to claim 42 wherein the first read controlled gate is coupled directly between the bit line and the second data IO line and the second read controlled gate is coupled directly between the complementary bit line and the first data IO line.

45. A circuit, comprising:
a read charge control circuit activated only during read operations by a read signal and an address;
a write charge control circuit activated by a write signal and the same or a different address, the read charge control circuit and the write charge control circuit both coupled to a first and a second data IO line, wherein the second data IO line is complementary to the first data IO line;
a data output sense amplifier coupled between a data output buffer and the first and second data IO lines; and
load transistors shared between the read charge control circuit and the data output sense amplifier.

46. A circuit, comprising:
a read charge control circuit that includes a first transistor having a first terminal coupled to a bit line, a second terminal coupled to the second data IO line, and a third terminal; a second transistor having a first terminal coupled to a complementary bit line, a second terminal coupled to the first data IO line, and a third terminal; and a third transistor having a first terminal coupled to a column select line, a second terminal coupled to the third terminal of the first and the second transistor, and a third terminal coupled to a first reference voltage; wherein the read charge control circuit is activated only during read operations by a read signal and an address; and
a write charge control circuit activated by a write signal and the same or a different address, the read charge control circuit and the write charge control circuit both coupled to a first and a second data IO line, wherein the second data IO line is complementary to the first data IO line.

47. The circuit according to claim 46 wherein the write charge control circuit comprises:
a first transistor having a first terminal coupled to a write column select line, a second terminal coupled to the complementary bit line, and a third terminal coupled to the second data IO line; and
a second transistor having a first terminal coupled to the write column select line, a second terminal coupled to the first data IO line, and a third terminal coupled to the bit line.

48. The circuit according to claim 47, further comprising:
a first load transistor having a first terminal coupled to a second reference voltage, a second terminal coupled to the first data IO line, and a third terminal coupled to a third reference voltage; and
a second load transistor having a first terminal coupled to the second reference voltage, a second terminal coupled to the second data IO line, and a third terminal coupled to the third reference voltage.

* * * * *

UNITED STATES PATENT AND TRADEMARK OFFICE
CERTIFICATE OF CORRECTION

PATENT NO. : 6,754,119 B2
DATED : June 22, 2004
INVENTOR(S) : Lee et al.

It is certified that error appears in the above-identified patent and that said Letters Patent is hereby corrected as shown below:

Column 3,
Line 50, "select line circuit" should read -- select line circuit. --.

Column 9,
Line 17, "sixth terminal, and" should read -- sixth terminal; and --.

Signed and Sealed this

Fifteenth Day of March, 2005

JON W. DUDAS
*Director of the United States Patent and Trademark Office*